US00RE44120E

(19) United States
(12) Reissued Patent
Shmaenok

(10) Patent Number: US RE44,120 E
(45) Date of Reissued Patent: Apr. 2, 2013

(54) FILTER FOR EXTREME ULTRAVIOLET LITHOGRAPHY

(75) Inventor: Leonid Shmaenok, Nieuwegein (NL)

(73) Assignee: ASML Netherlands B.V., Veldhoven (NL)

(21) Appl. No.: 13/276,888

(22) Filed: Oct. 19, 2011

Related U.S. Patent Documents

Reissue of:
(64) Patent No.: 6,359,969
Issued: Mar. 19, 2002
Appl. No.: 09/641,455
Filed: Aug. 18, 2000

U.S. Applications:
(63) Continuation of application No. 10/803,201, filed on Mar. 18, 2004, now Pat. No. Re. 43,036, which is a continuation of application No. PCT/NL99/00090, filed on Feb. 19, 1999.

(30) Foreign Application Priority Data

Feb. 19, 1998 (NL) ..... 1008352

(51) Int. Cl.
*G21K 3/00* (2006.01)
(52) U.S. Cl. ..... 378/156; 378/158
(58) Field of Classification Search ..... 378/147–159
See application file for complete search history.

(56) References Cited

U.S. PATENT DOCUMENTS

| | | | |
|---|---|---|---|
| 1,865,441 | A | 7/1932 | Mutscheller |
| 3,418,467 | A | 12/1968 | Spielberg |
| 4,242,588 | A | 12/1980 | Silk |
| 4,340,818 | A | 7/1982 | Barnes |
| 4,408,338 | A | 10/1983 | Grobman |
| 4,672,648 | A | 6/1987 | Mattson |
| 4,741,012 | A | 4/1988 | Duinker |
| 4,825,454 | A | 4/1989 | Annis |
| 4,837,794 | A | 6/1989 | Riordan |
| 5,099,134 | A | 3/1992 | Hase |
| 5,265,144 | A | 11/1993 | Harding |
| 5,550,678 | A | 8/1996 | Morby |
| 5,570,408 | A | 10/1996 | Gibson |
| 5,768,339 | A | 6/1998 | O'Hara |
| 6,275,568 | B1 | 8/2001 | Prins |
| 6,838,684 | B2 | 1/2005 | Bakker |
| 7,034,308 | B2 | 4/2006 | Bakker |
| 7,057,190 | B2 | 6/2006 | Bakker |
| 7,106,832 | B2 | 9/2006 | Klunder |
| 7,145,132 | B2 | 12/2006 | Bakker |
| 7,332,731 | B2 | 2/2008 | Klunder |
| 7,442,948 | B2 | 10/2008 | Wassink |
| 7,468,521 | B2 | 12/2008 | Klunder |
| 2006/0139604 | A1 | 6/2006 | Wassink |

(Continued)

FOREIGN PATENT DOCUMENTS

| | | |
|---|---|---|
| EP | 0 682 125 A1 | 11/1995 |
| EP | 1 274 287 | 1/2003 |

(Continued)

OTHER PUBLICATIONS

European Office Action for European Application No. 03076346.0, dated Jan. 25, 2010.

(Continued)

*Primary Examiner* — Irakli Kiknadze
(74) *Attorney, Agent, or Firm* — Pillsbury Winthrop Shaw Pittman LLP

(57) ABSTRACT

An apparatus, suited, for example, for extreme ultraviolet lithography, includes a radiation source and a processing organ for processing the radiation from the radiation source. Between the radiation source and the processing organ a filter is placed which, in the radial direction from the radiation source, comprises a plurality of foils or plates.

21 Claims, 2 Drawing Sheets

U.S. PATENT DOCUMENTS

| | | | |
|---|---|---|---|
| 2006/0169929 | A1 | 8/2006 | Wassink |
| 2006/0186353 | A1 | 8/2006 | Wassink |
| 2006/0219958 | A1 | 10/2006 | Wassink |
| 2006/0261290 | A1 | 11/2006 | Wilhelmus Van Herpen et al. |
| 2007/0018118 | A1 | 1/2007 | Sjmaenok |
| 2007/0023706 | A1 | 2/2007 | Sjmaenok |

FOREIGN PATENT DOCUMENTS

| | | | |
|---|---|---|---|
| GB | 2 083 969 | A | 3/1982 |
| JP | 07-180042 | | 7/1995 |
| JP | 08-321395 | | 12/1996 |
| JP | 09-237695 | | 9/1997 |
| JP | 09-245992 | | 9/1997 |
| JP | 09-320792 | | 12/1997 |
| JP | 2000-98098 | | 4/2000 |
| JP | 2001-57298 | | 2/2001 |
| WO | WO 96/10324 | | 4/1996 |
| WO | WO 99/42904 | | 8/1999 |
| WO | WO 01/37309 | | 5/2001 |

OTHER PUBLICATIONS

European Office Action for European Application No. 03076346.0, dated Aug. 19, 2009.

Japanese Office Action as issued for Japanese Patent Application No. 2000-532779, dated Sep. 3, 2007.

"Collimator For X-Ray Lithography", *IBM Technical Disclosure Bulletin,* vol. 33, No. 4, pp. 278-279, Sep. 1990.

M. Vartanian et al., "Polycapillary Collimator For Point Source Proximity X-ray Lithography", *Journal of Vacuum Science & Technology*, Part B, vol. 11, No. 6, Nov. 1993, p. 3003-3007.

Amended

FILTER FOR EXTREME ULTRAVIOLET LITHOGRAPHY

Matter enclosed in heavy brackets [ ] appears in the original patent but forms no part of this reissue specification; matter printed in italics indicates the additions made by reissue.

*More than one reissue application has been filed for the reissue of U.S. Pat. No. 6,359,969. The reissue applications are continuation reissue application Ser. No. 13/276,888 (the present application) and parent reissue application Ser. No. 10/803,201 which is now RE43036, all of which are reissue applications of U.S. Pat. No. 6,359,969.*

CROSS-REFERENCE TO RELATED APPLICATION

This application is a *continuation reissue application of U.S. Reissue application Ser. No. 10/803,201, filed Mar. 18, 2004 now U.S. Pat. No. Re. 43,036, which is a reissue application of U.S. application Ser. No. 09/641,455 (now U.S. Pat. No. 6,359,969), filed Aug. 18, 2000, which is in turn a* continuation of International *Patent* Application No. PCT/NL99/00090, filed Feb. 19, 1999.

BACKGROUND OF THE INVENTION

Apparatus suited for extreme ultraviolet lithography, comprising a radiation source and a processing organ for processing the radiation from the radiation source, and a filter for suppressing undesired atomic and microscopic particles which are radiated by a radiation source.

The invention relates to an apparatus comprising a radiation source and a processing organ for processing the radiation from the radiation source, wherein a filter is placed between the radiation source and the processing organ, which filter comprises a plurality of foils or plates.

Such an apparatus may be used in the production of integrated circuits, that is to say in a lithographical application. The invention may also be applied in various other fields. For a good understanding of the invention, however, a lithographical application will serve well as illustration. Continuous attempts are made to make integrated circuits smaller and smaller in order to improve the processing speed of the integrated circuits.

According to the prior art, such integrated circuits are manufactured chiefly by using lithography with visible and ultraviolet light. With these known technologies, it is possible to manufacture integrated circuits that may be as short as 120 nanometers. The ultraviolet light used with said circuits has a wavelength of 193 nanometers. The known techniques do not allow a further decrease of the dimensions of the integrated circuits, and a possible solution is the use of lithography on the basis of extreme ultraviolet light. Such light has a wavelength of 13 nanometers. The known optical elements cannot be used at this wavelength. The known mirrors and lenses absorb too large a portion of the extreme ultraviolet light. In order to allow for this, the processing organ for processing the radiation from the radiation source is a multi-layer mirror which consists of 40 or more molybdenum layers alternating with silicon layers.

In such an apparatus for extreme ultraviolet lithography a laser plasma source is used to generate a plasma by heating an object by means of a laser source of high energy density, for example of at least $10^{11}$ W/cm$^2$. The object heated by the laser will function as source of secondary emission of mainly shortwave radiation. However, this will also release undesirable particles and atoms producing the effect of debris in the apparatus. The objective of the invention is to prevent the production of said debris.

WO 96/10324 discloses such an apparatus for the generation of radiation. This apparatus uses a fast rotating target which is heated by the laser source and which produces the secondary emission. Due to the kinetic energy of the particles formed from the plasma on the rotating target, this apparatus has a filtering effect in respect of the so-called macro-particles. However, trapping atoms, and in particular the fastest micro-particles, is not possible in this known apparatus.

U.S. Pat. No. 4,837,794 concerns a filter apparatus comprising a radiation source and a processing organ for processing the radiation from the radiation source, wherein a filter is placed between the radiation source and the processing organ, which filter comprises a plurality of foils or plates, including a baffle for diffusing hot gases and directing them away from a window of sight. Due to the placement of the baffle, the said window of sight is rather narrow.

BRIEF SUMMARY OF THE INVENTION

It is the object of the invention to circumvent the drawbacks of the prior art. According to the invention, this is realized by the apparatus, for example for extreme ultraviolet lithography, comprising a radiation source and a processing organ for processing the radiation from the radiation source, wherein a filter is placed between the radiation source and the processing organ, which filter comprises a plurality of foils or plates, which is characterized in that each foil or plate essentially points in the radial direction when viewed from the radiation source. Surprisingly, it has been shown that this very simple measure not only makes it possible to trap atoms and micro-particles, but also clusters of such micro-particles, respectively the smallest macro-particles.

Quite advantageous is that the apparatus according to the invention shows no limitation with respect to the effectively usable angle of sight due to the fact that the apparatus embodied with the filter according to the invention provides full optical transparency.

A first preferred embodiment of the apparatus according to the invention is characterized in that the foils or plates are positioned in a honeycomb construction.

A second preferred embodiment of the apparatus according to the invention is characterized in that the foils or plates are cone-shaped and are positioned concentrically.

Preferably, in the radial direction the foils or plates are positioned such as to be evenly distributed in relation to one another.

Such an apparatus is used with a buffer gas in which the radiation source and the processing organ are placed. Appropriately, the distance between the radiation source and the filter's proximal end in relation to the radiation source is then selected subject to the pressure and the type of buffer gas. A very suitable choice of buffer gas is krypton, whose pressure is 0.5 Torr, and the distance between the radiation source and the proximal end of the filter is 5 cm. This setting affords sufficient opportunity for the particles to be trapped in the filter to take on the temperature of the buffer gas, for example room temperature, thereby sufficiently reducing the particle's velocity before it enters the filter.

It is further desirable to select the length of the filter, which is formed by the distance between the filter's proximal end and its distal end in relation to the radiation source, subject to the pressure of the buffer gas and the form of the filter. Especially the gas pressure determines the mean free path length for the particles to be trapped; a lower gas pressure corresponds to an increased free path length. This can be partially compensated by the form of the filter. For example, using the above-mentioned honeycomb construction provides a larger surface area, affording greater opportunity for the particles to actually be trapped.

It has been shown that good results can be obtained when the length of the filter is at least 1 cm. This filter length corresponds with a usual gas pressure of, for example, 100 mTorr.

As already mentioned above, the apparatus is operational at room temperature. The measure of maintaining the filter at a temperature which is approximately below room temperature allows the residence time of the atoms and particles trapped on a foil or plate to be increased, and accordingly the effectiveness of the filter to be improved.

It is further desirable that the number of plates in the filter should be adjusted subject to the thickness of each plate and the desired optical transparency of the filter as determined by the formula $$\frac{d}{d+d_f}\times 100\%$$

in which d=the distance between two plates of the filter at the side of the radiation source; and $d_f$=the thickness of a plate of the filter.

In this way the light output of the integral apparatus can be maintained at an adequate level, while the effectiveness of the filter can still be 100%. The apparatus is then preferably characterized in that the number of plates is adjusted such that the distance between two plates is approximately 1 mm.

The effectiveness of the filter may be improved further by roughening the surface of the plates.

The invention is further embodied in a separate filter for suppressing undesirable atomic and microscopic particles emitted by a radiation source, wherein a plurality of plates are positioned substantially parallel in relation to one another, for trapping atomic and microscopic particles on their respective surfaces.

Such a separate filter is characterized in that the plates are directed radially from the radiation source.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings.

In the Figs., identical reference numbers relate to similar parts.

DETAILED DESCRIPTION OF THE INVENTION

Figure 1:
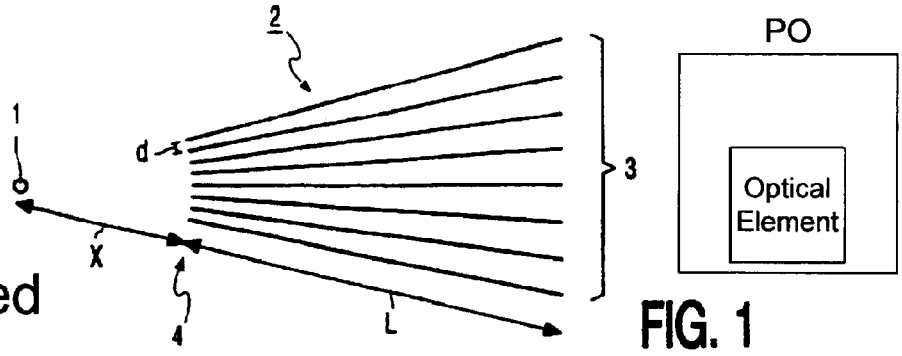
FIG. 1 shows schematically a radiation source together with a filter according to the invention.
Figure 3:
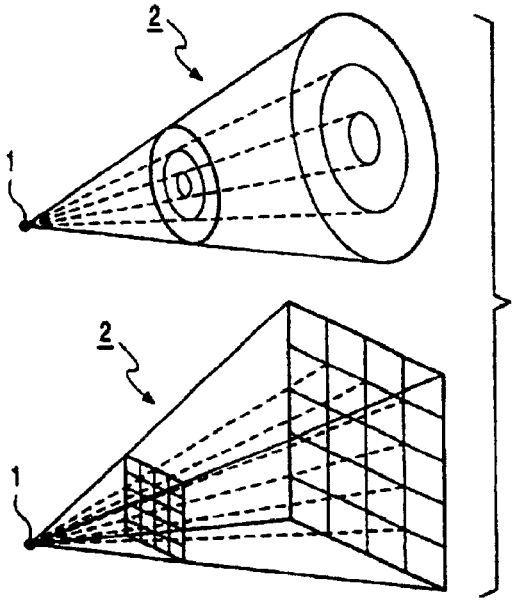
FIG. 3 shows schematically two more preferred embodiments of the filter according to the invention[.]*; and*
Figure 4:
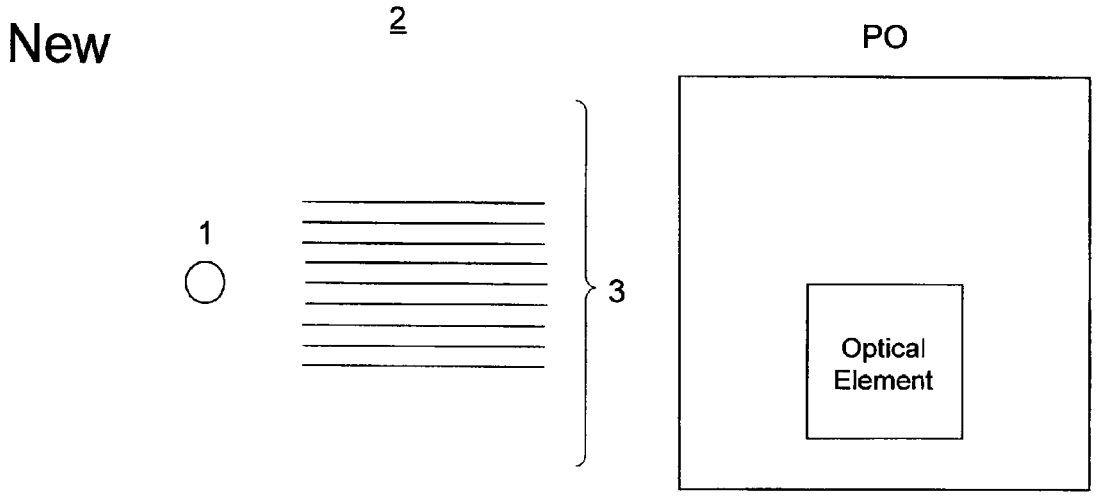
*FIG. 4 shows schematically an embodiment of the filter according to the invention.*

FIG. 1 shows a radiation source indicated by reference number 1, and a filter which is generally indicated by reference number 2. The processing organ that is used in the apparatus for, for example, extreme ultraviolet lithography, is [not] shown *as PO*. This processing organ is located at the side of the filter 2 facing away from the radiation source 1. The filter 2 comprises a number of plates 3 positioned in a radial direction from the radiation source 1. It is possible to position said plates in a honeycomb construction, or as a plurality of concentric cones as shown in FIG. 3.

Figure 2:
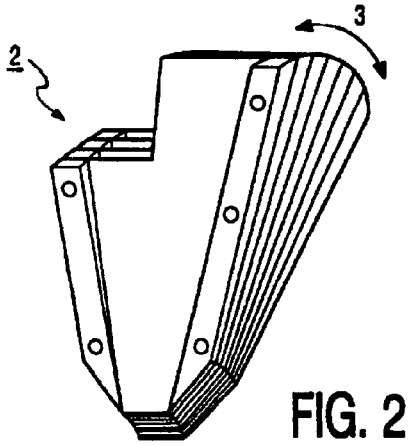
FIG. 2 shows a preferred embodiment of the filter according to the invention; [and]

FIGS. 1 and 2 show that in the direction of radiation from the source 1, the plates are positioned such as to be evenly distributed next to one another. The proximal end 4 of the filter 2 is at a distance X from the radiation source 1, which distance is selected depending on the pressure and the type of buffer gas in which the radiation source 1, the processing organ (not shown), and also the filter 2, are placed. If the apparatus is used for extreme ultraviolet lithography, the buffer gas is preferably krypton having a pressure of 0.5 Torr, and the value of X may be 5 cm. The length of the plates of the filter is indicated by L. The value of L is selected depending on the pressure of the buffer gas and the form of the filter 2. The value of L, that is to say the length of the filter, is at least 1 cm. In FIG. 1, this value is approximately 10 cm. The thickness of the plates 3 may be, for example, 0.1 mm, and the spacing between the plates at the side nearest the radiation source 1, may be approximately 1 mm. This may result in an optical transparency of the filter 2, which is determined by the formula $$\frac{d}{d+d_f}\times 100\%$$

in which d=the distance between two plates of the filter at the proximal side of the filter; and $d_f$=the thickness of a plate of the filter.

The effectiveness of the filter can be promoted if the surface of the plates 3 is slightly roughened.

When the apparatus is used for extreme ultraviolet lithography, radiation is used having a wavelength of 13.5 nanometers. Various inert gasses may be used as buffer gas, such as helium and krypton which, compared with other gasses have the lowest absorption coefficient at this wavelength. Krypton is better able to meet the requirements of the present application because the atomic mass of krypton is more compatible with that of the atomic- and microparticles emitted by the radiation source, which augments the inhibition of said undesirable particles. The krypton gas used is maintained at a pressure of at least several mTorr. It should be noted that taken over a distance of 20 cm at a pressure of 0.5 Torr, the optical transparency of krypton for the desired radiation is approximately 90%. The filter used in the apparatus is comprised of copper plates (other materials are also possible) which have a length of 7 cm and are positioned at 2 cm from the radiation source. At a plate thickness of 0.2 mm and with the plates being spaced at approximately 0.8 mm at the side of the radiation source, the filter will have a geometrical transparency of approximately 80%. The effectiveness of the filter was measured at room temperature and at a temperature of approximately −90° C. At both these temperatures the effectiveness of the filter was shown to be very high, almost 100.

It will be clear to the person skilled in the art that the various dimensions of the filter forming part of the apparatus according to the invention, as well as the distance from the filter to the radiation source, has to be determined in practice on the basis of the above-mentioned inter-relating ratios. It is therefore possible to apply diverse variations to the above description, without departing from the idea of the invention as specified in the appended claims.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An apparatus comprising a radiation source and a processing organ for processing radiation from the radiation source, wherein a filter for suppressing undesired atomic and microscopic particles is placed between the radiation source and the processing organ, which filter comprises a plurality of foils or plates having surfaces for trapping atomic and microscopic particles thereon, wherein each foil or plate essentially points in a radial direction when viewed from the radiation source.

2. The apparatus according to claim 1, wherein the foils or plates are positioned in a honeycomb construction.

3. The apparatus according to claim 1, wherein the foils or plates are coneshaped and are positioned concentrically.

4. The apparatus according to claim 1, wherein in the radial direction the foils or plates are positioned such as to be evenly distributed in relation to one another.

5. The apparatus according to claim 1, wherein the radiation source and the processing organ are placed in a buffer gas, and wherein a distance between the radiation source and a proximal end of the filter in relation to the radiation source is selected subject to a pressure and a type of buffer gas.

6. The apparatus according to claim 5, wherein the buffer gas is krypton, wherein the pressure is at least approximately 0.1 Torr, and wherein the distance between the radiation source and the proximal end of the filter is 5 cm.

7. The apparatus according to claim 5, wherein a length of the filter, which is formed by the distance between the proximal end of the filter and its distal end in relation to the radiation source, is selected subject to the pressure of the buffer gas and a form of the filter.

8. The apparatus according to claim 7, wherein the length of the filter is at least 1 cm.

9. The apparatus according to claim 1, wherein the number of plates in the filter is adjusted subject to a thickness of each plate and a desired optical transparency of the filter as determined by the formula $$\frac{d}{d + d_f} \times 100\%$$

in which d=a distance between two plates of the filter at a proximal side of the filter; and $d_f$=a thickness of a plate of the filter.

10. The apparatus according to claim 9, wherein the number of plates is adjusted such that the distance between two plates is approximately 1 mm.

11. The apparatus according to claim 1, wherein a surface of the plates is [rough] *roughened to increase suppression of the undesired atomic and microscopic particles*.

12. A filter for suppressing undesired atomic and microscopic particles which are emitted by a radiation source, wherein a plurality of plates are positioned substantially parallel in relation to one another, for trapping atomic and microscopic particles on their respective surfaces, wherein the plates are directed [radially] *away* from the radiation source.

*13. The filter according to claim 12, wherein the plates are positioned in a honeycomb construction.*

*14. The filter according to claim 12, wherein the plates are positioned such as to be evenly distributed in relation to one another.*

*15. The filter according to claim 12, wherein the filter is to be disposed in a buffer gas, and wherein a distance between the radiation source and a proximal end of the filter in relation to the radiation source is selected subject to a pressure and a type of the buffer gas.*

*16. The filter according to claim 15, wherein the buffer gas is krypton, wherein the pressure is at least approximately 0.1 Torr, and wherein the distance between the radiation source and the proximal end of the filter is 5 cm.*

*17. The filter according to claim 12, wherein a length of the filter, which is the distance between a proximal end of the filter and a distal end of the filter in relation to the radiation source, is selected subject to a pressure of a buffer gas, in which the filter is to be disposed, and a form of the filter.*

*18. The filter according to claim 17, wherein the length of the filter is at least 1 cm.*

*19. The filter according to claim 12, wherein the number of plates in the filter, a thickness of a plate in the filter, a distance between two plates in the filter or any combination thereof is based on a desired optical transparency of the filter as determined by the formula:*

$$\frac{d}{d + d_f} \times 100\%$$

*wherein d is a distance between two plates of the filter at a proximal end of the filter in relation to the radiation source and $d_f$ is a thickness of a plate of the filter.*

*20. The filter according to claim 19, wherein the distance between two plates in the filter is approximately 1 mm.*

*21. The filter according to claim 12, wherein a surface of the plates is roughened to increase suppression of the undesired atomic and microscopic particles.*

* * * * *